United States Patent
Yang

(10) Patent No.: US 6,586,976 B2
(45) Date of Patent: Jul. 1, 2003

(54) CHARGE PUMP CIRCUIT FOR IMPROVING SWITCHING CHARACTERISTICS AND REDUCING LEAKAGE CURRENT AND PHASE LOCKED LOOP HAVING THE SAME

(75) Inventor: Sung-gi Yang, Yongin (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 09/946,701

(22) Filed: Sep. 5, 2001

(65) Prior Publication Data

US 2002/0089382 A1 Jul. 11, 2002

(30) Foreign Application Priority Data

Jan. 6, 2001 (KR) .......................................... 2001-842

(51) Int. Cl.$^7$ ................................................ H03L 7/06
(52) U.S. Cl. ........................................ 327/157; 331/17
(58) Field of Search ................................. 327/148, 157, 327/156, 147; 331/17

(56) References Cited

U.S. PATENT DOCUMENTS

| | | | |
|---|---|---|---|
| 5,285,114 A | 2/1994 | Atriss et al. | ................ 307/264 |
| 5,362,990 A | 11/1994 | Alvarez et al. | ............. 327/538 |
| 5,532,636 A | 7/1996 | Mar et al. | .................... 327/543 |
| 6,316,977 B1 * | 11/2001 | Sargeant | ..................... 327/157 |

FOREIGN PATENT DOCUMENTS

| | | | | |
|---|---|---|---|---|
| DE | 19910113 C1 | * | 8/2000 | ........... H03L/7/085 |
| EP | 1037366 A2 | * | 9/2000 | ............ H02M/3/00 |
| JP | 2001-177400 A | * | 6/2001 | .......... H03K/17/62 |
| KR | 2000-0062900 | | 10/2000 | ............ H04N/5/12 |

OTHER PUBLICATIONS

Rhee, W., *Design of High–Performance CMOS Charge Pumps in Phase–Locked Loops,* IEEE Int'l. Symp. Circuit and System, pp. 545–548, 1999.

Waizman, A., *A Delay Line Loop for Frequency Synthesis of De-skewed Clock,* IEEE Int'l. Symp. Solid–State Circuit, pp. 298–299, 1994

Kaenel, V., et al., *A 320 MHz, 1.5mW at 1.35V CMOS PLL for Microprocessor Clock Generation,* IEEE Int'l. Symp. Solid–State Circuit, pp. 132–133, 1996.

* cited by examiner

Primary Examiner—Terry D. Cunningham
Assistant Examiner—Quan Tra
(74) Attorney, Agent, or Firm—F. Chau & Associates, LLP

(57) ABSTRACT

A charge pump circuit capable of improving the matching and switching characteristics, charge current, and discharge current and reducing leakage current and a phase locked loop including the charge pump circuit. In one aspect, the charge pump circuit comprise a first current source for sourcing current to an output terminal of the charge pump circuit in response to first bias voltage, a first switching device which is switched in response to a first control signal and a pull-down device for pulling down the voltage of a connection node of the first switching device between the first current source in response to the first control signal. In another aspect, the charge pump circuit comprises a second current source for sinking current from the output terminal of the charge pump circuit in response to second bias voltage, a second switching device which is switched in response to a second control signal and a pull-up device for pulling up the voltage of a connection node between the second switching device and the second current source in response to the second control signal.

8 Claims, 8 Drawing Sheets

CHARGE PUMP CIRCUIT FOR IMPROVING SWITCHING CHARACTERISTICS AND REDUCING LEAKAGE CURRENT AND PHASE LOCKED LOOP HAVING THE SAME

BACKGROUND

1. Technical Field of the Invention

The present invention relates to a semiconductor circuit, and more particularly, to a charge pump circuit for improving switching characteristics and reducing leakage current and a phase locked loop having the same.

2. Description of Related Art

A phase locked loop (PLL) comprises a circuit for synchronizing the frequency of an output signal of a voltage controlled oscillator with the frequency of an input signal. PLLs are typically utilized for applications such as signal synchronization and frequency synthesization.

In general, a phase-locked loop comprises a phase detector, a charge pump circuit, a loop filter and a voltage controlled oscillator, which are connected in series. The phase detector monitors the difference in phase between an input signal and an output signal of the voltage controlled oscillator and then outputs either an up control signal or a down control signal to the loop filter based on the detected phase difference.

In particular, the loop filter, which typically comprises a capacitor with a large capacitance, charges the capacitor in response to the up control signal so that the output voltage of the loop filter increases. When the output voltage of the loop filter increases, the frequency of the voltage controlled oscillator increases.

Also, the output voltage of the loop filter decreases when the capacitor discharges in response to the down control signal. The frequency of the voltage controlled oscillator decreases when the output voltage of the loop filter decreases.

In other words, if the up control signal is active (that is, logic 'high'), the charge pump circuit supplies a charge current having a predetermined magnitude to the capacitor of the loop filter. If the down control signal is active, the charge pump circuit draws a discharge current having the same magnitude from the capacitor of the loop filter. In essence, the charge pump circuit is a circuit for controlling the output voltage of the loop filter.

To remove a dead zone in which the PLL cannot detect a minute phase difference, the up and down control signals become active simultaneously for a short time even in a locked state. At this time, the output voltage of the loop filter is maintained at a constant level (so as to stabilize the output frequency of the voltage controlled oscillator) only if the amount of the charge current flowing to the loop filter is exactly the same as that of the discharge current flowing from the loop filter.

However, if there is a difference in phase between the charge current and the discharge current, spurious signals appear in the spectrum of the output signal of the voltage controlled oscillator. To equalize the charge current and the discharge current of the loop filter, their normal states and switching characteristics responding to the up and down control signals are made to be identical with each other.

Also, if the up and down control signals become inactive, the output impedance of the charge pump circuit approaches infinity. Then, only if the amount of leakage current flowing to/from the loop filter is very little, the output voltage of the loop filter is maintained at a constant level.

FIG. 1 is a circuit diagram illustrating a conventional drain-switched charge pump circuit 10. Referring to FIG. 1, the drain-switched charge pump circuit 10 includes a first reference current source 11, a first current mirror circuit 15 having PMOS transistors P1 and P2 and a first capacitor C1, a first switching transistor P3 responsive to an up control signal UP, a second reference current source 13, a second current mirror circuit 17 having NMOS transistors N1 and N2 and a second capacitor C2, and a second switching transistor N3 responsive to a down control signal DN.

Assume that the PMOS transistors P1 and P2 have the same aspect ratio (i.e., the ratio of the width of a channel to the length of the channel) and that the first switching transistor P3 is turned on, the first reference current up REF (i.e., charge current) flows into the drain of the first switching transistor P3. Further, assuming that the NMOS transistors N1 and N2 have the same aspect ratio and that the second switching transistor N3 is turned on, the second reference current $I_{DN,REF}$ (i.e., discharge current) flows to ground Vss through the drain of the second switching transistor N3.

The moment the first and second switching transistor P3 and N3 of the drain-switched charge pump circuit 10 are turned on or turned off, a peak current is generated due to difference in drain-source voltage between the transistors P2 and N2 connected in series and the first and second switching transistors P3 and N3. Consequently, at the moment of switching, the matching characteristics of the charge current $I_{UP,REF}$ and the discharge current $I_{DN,REF}$ are extremely poor.

FIG. 2 is a circuit diagram illustrating a conventional gate-switched charge pump circuit 20. Referring to FIG. 2, the gate-switched charge pump circuit 20 includes a first reference current source 21, a charge unit 25 having a first capacitor C3 and PMOS transistors P21, P22, P23, and P24, a second reference current source 23, and a discharge unit 27 having a second capacitor C4 and NMOS transistors N21, N22, N23 and N24.

The charge unit 25 includes a charging transistor P22, a first switching transistor P23 for switching the charging transistor P22, and a second switching transistor P24, which reduces the switching load of the PMOS transistor P21 and complementarily switches with the first switching transistor P23. Thus, in the case of switching with the second switching transistor P24, the voltage of the source of the second switching transistor P24 is not changed.

The discharge unit 27 includes the discharging transistor N22, the third switching transistor N23 for switching the discharging transistor N22, and the fourth switching transistor N24, which reduces the switching load of the NMOS transistor N21 and complementarily switches with the third switching transistor N23. Thus, in the case of switching with the fourth switching transistor N24, the voltage of the drain of the fourth switching transistor N24 is not changed.

One problem associated with the conventional gate-switched charge pump circuit 20 is that switching transistors P23, P24, N23 and N24, which generate and respectively respond to an UP control signal, an inverted UP control signal, a DN control signal and an inverted DN control signal, must be realized in the gate switched charge pump circuit 20.

Moreover, when the switching transistors P23 and P24 are switched, there exists a period during which they are simultaneously turned on. Accordingly, electric charge stored in the capacitor C3 is discharged into power supply voltage Vdd. Similarly, when the transistors N23 and N24 are switched, there also exists a period during which they are simultaneously turned on. At this time, electric charge stored in the capacitor C4 is discharged into the ground voltage Vss.

The source voltage of the switching transistor P24 and the drain voltage of the switching transistor N24 are not maintained at a constant level and thus before and after switching, the first reference current $I_{UP\_REF}$ and the second reference current $I_{DN\_REF}$ are not exactly mirrored to the charge current and the discharge current, respectively. Thus, the matching characteristics of the charge current and the discharge current are extremely poor.

FIG. 3 is a circuit diagram illustrating a conventional source-switched charge pump circuit 30. In FIG. 3, the source-switched charge pump circuit 30 includes a first reference current source 31, a first current mirroring circuit consisting of PMOS transistors P31 and P32, a first switching transistor P33, a first matching transistor P34 for matching voltage drops occurring in the first switching transistor P33. The circuit 30 further includes a second reference current source 33, a second current mirroring circuit consisting of NMOS transistors N31 and N32, a second switching transistor N33 and a second matching transistor N34 for matching voltage drops occurring in the second switching transistor N33.

In a case where an up control signal UP becomes active and then the first switching transistor P33 is turned on, node "a" is quickly charged to the power supply voltage Vdd. However, in a case where the first switching transistor P33 is turned off, the path for charging node "a" is disconnected. Also, in a case where a down control signal DN becomes active and then the second switching transistor N33 is turned on, node "b" is quickly discharged to the ground voltage Vss. However if the second switching transistor P33 is turned off, the path for discharging node "b" is disconnected. Consequently, switching is performed very slowly thereby deteriorating the matching characteristics of the charge current $I_{UP\_REF}$ and the discharge current $I_{DN\_REF}$.

In a state in which the charge pump circuits 10, 20 and 30 illustrated in FIGS. 1, 2 and 3, respectively, are turned off, output transistors P2, N2, P22, N22, P32 and N32 have a gate-source voltage of 0V which is not less than the threshold voltage. Therefore, when an up control signal and a down control signal are inactive (that is, logic 'low'), leakage current flows. Particularly, as the operational temperature of a charge pump increases, the leakage current increases exponentially, thereby negatively affecting the operation of a phase locked loop (PLL).

SUMMARY OF THE INVENTION

To solve the above problems, it is an object of the present invention to provide a charge pump circuit that is capable of improving the matching and switching characteristics of charge current and discharge current and reducing leakage current, and to provide a phase locked loop comprising the charge pump circuit.

According to one embodiment of the present invention, a charge pump circuit comprises a first current source, a first switching device, and a pull-down device. The first current source sources current to an output terminal of the charge pump circuit in response to a first bias voltage. The first switching device is connected between a first power supply and the first current source and is switched in response to a first control signal, and the pull-down device pulls down the voltage of a connection node between the first current source and the first switching device.

The charge pump circuit further comprises a second current source, a second switching device, and a pull-up device. The second current source sinks current from an output terminal of the charge pump circuit in response to a second bias voltage. The second switching device is connected between a second power supply and the second current source and is switched in response to a second control signal, and the pull-up device pulls up the voltage of a connection node between the second current source and the second switching device. The charge pump circuit further comprise a first bias circuit for generating the first bias voltage and a second bias circuit for generating the second bias voltage.

According to another embodiment of the present invention, a charge pump circuit comprises a first current source, a second current source, a first switching device, a first pull-down device, and a second pull-down device. The first current source sources current to a first node in response to a first bias voltage. The second current source is connected between the first node and an output terminal of the charge pump circuit and sources current to the output terminal of the charge pump circuit in response to a second bias voltage. The first switching device is connected between a first power supply and the first current source and is switched in response to a first control signal. The first pull-down device pulls down the voltage of a connection node between the first current source and the first switching device in response to the first control signal, and the second pull-down device pulls down the voltage of the first node in response to the first control signal.

The charge pump circuit further comprise a third current source, a fourth current source, a second switching device, a first pull-up device, and a second pull-up device. The third current source sinks current from a second node in response to a third bias voltage. The fourth current source is connected between the third current source and the output terminal of the charge pump circuit and sinks current from the output terminal of the charge pump circuit in response to a fourth bias voltage. The second switching device is connected between the third current source and a second power supply and is switched in response to a second control signal. The first pull-up device pulls up the voltage of a connection node between the third current source and the second switching device in response to the second control signal, and the second pull-up device pulls up the voltage of the second node in response to the second control signal.

According to another embodiment of the present invention, a phase locked loop comprises a loop filter, a voltage-controlled oscillator, a phase detector and a charge pump circuit. The voltage-controlled oscillator outputs an internal signal in response to an output signal of the loop filter. The phase detector detects a difference in phase between a reference signal and the internal signal and outputs a first control signal or a second control signal. The charge pump circuit, which is operatively connected between the phase detector and the loop filter, controls the output voltage of the loop filter in response to the first control signal or the second control signal. The charge pump circuit comprises an architecture of a charge pump circuit according any one of the embodiments of the present invention.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
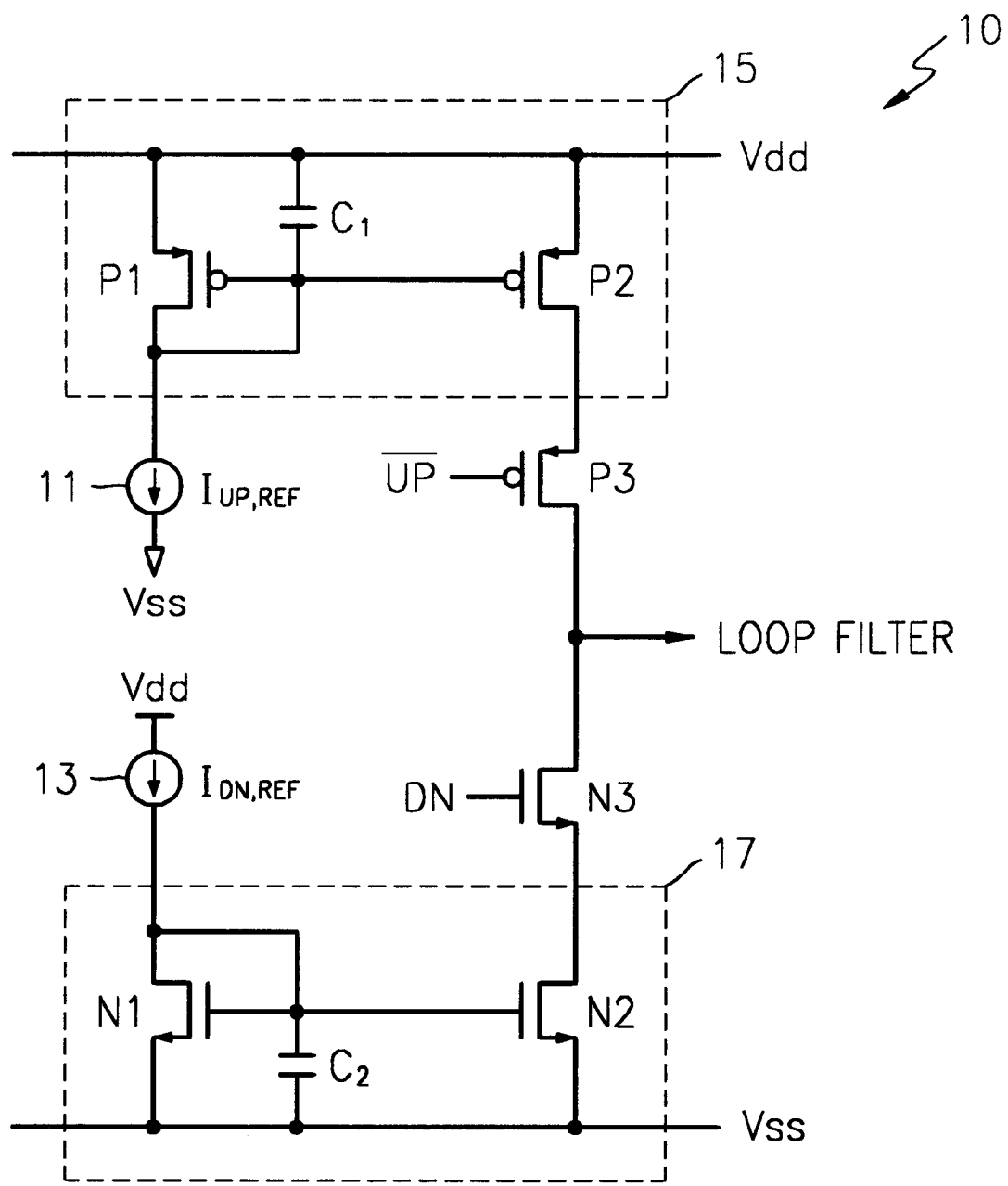
FIG. 1 is a diagram illustrating a conventional drain-switched charge pump.

The present invention will now be described more fully with reference to the accompanying drawings, in which preferred embodiments of the invention are shown. The same reference numerals in different drawings represent the same element.

Figure 4:
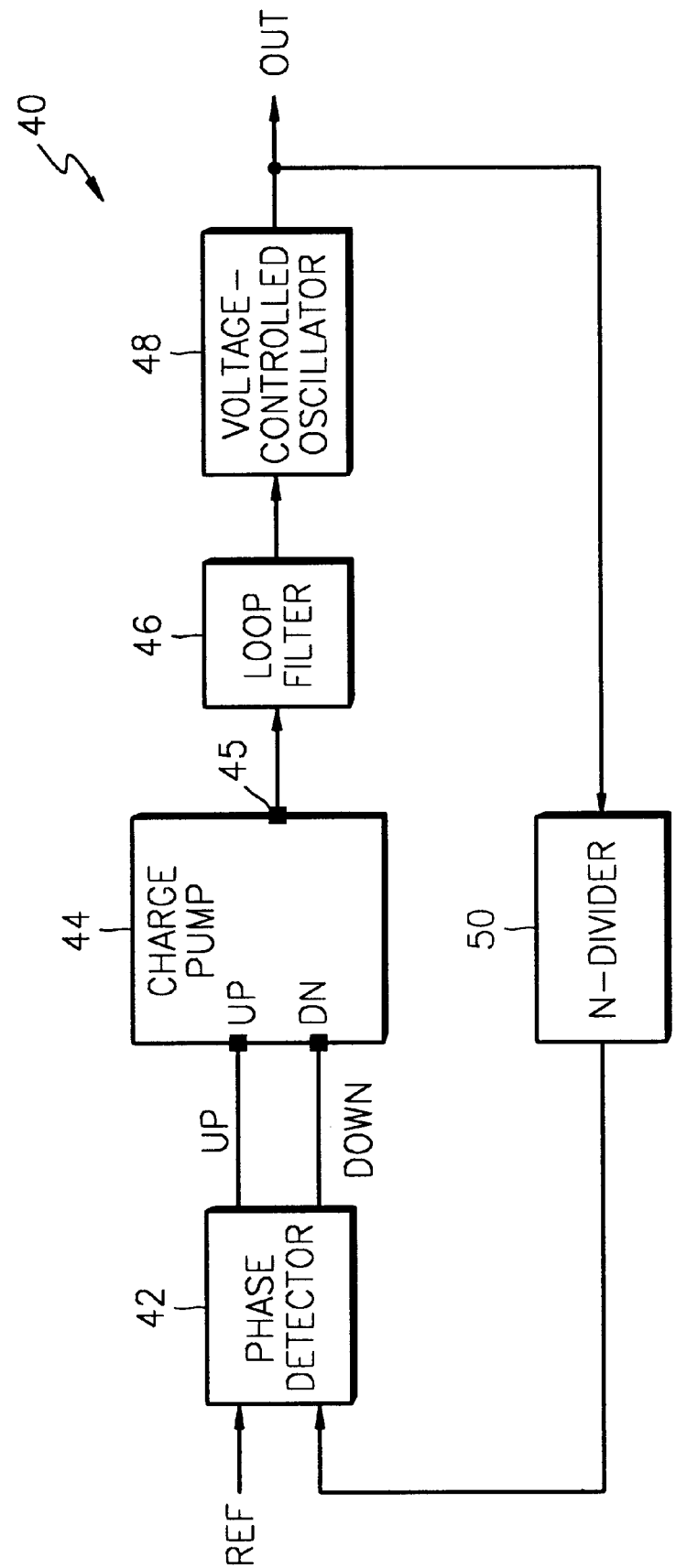
FIG. 4 is a block diagram illustrating a phase locked loop comprising a charge pump according to an embodiment of the present invention.

FIG. 4 illustrates a phase locked loop (PLL) 40 comprising a source-switched charge pump 44 according to an embodiment of the present invention. In FIG. 4, the PLL 40, which is realized in an integrated circuit (IC), includes a phase detector 42, a charge pump 44, a loop filter 46, a voltage controlled oscillator 48 and an N-divider 50.

The phase detector 42 monitors the difference in phase between a reference signal REF and an output signal of the N-divider 50 and, in response, outputs an up control signal UP or a down control signal DN to the charge pump 44. The N-divider divides an output signal of the voltage controlled oscillator 48 into N (where N is a natural number).

The charge pump 44 outputs charge current to the loop filter 46 via an output terminal 45 in response to the up control signal UP. The loop filter 46 increases the electric charge of a capacitor (not shown) using the charge current and then increases a direct-current (DC) output voltage. In response to the increased DC output voltage of the loop filter 46, the voltage controlled oscillator 48 increases the frequency of an output signal OUT.

Moreover, the charge pump 44 discharges the electric charge stored in the capacitor of the loop filter 46 in response to the down control signal DN, which results in a reduction of the DC output voltage of the loop filter 46. Then in response to the decreased output voltage of the loop filter 46, the voltage controlled oscillator 48 reduces the frequency of the output signal OUT.

The PLL will enter a "locked" mode when the frequency of the reference signal REF and the frequency of an output signal of the N-divider 50 are in phase synchronization. During the period in which the PLL is locked, the DC output voltage of the loop filter 46 remains constant.

It is quite clear to those skilled in the art that even if the PLL of FIG. 4 does not include the N-divider 50, the output signal of the voltage controlled oscillator 48 can be directly input to the phase detector 42.

Figure 5:
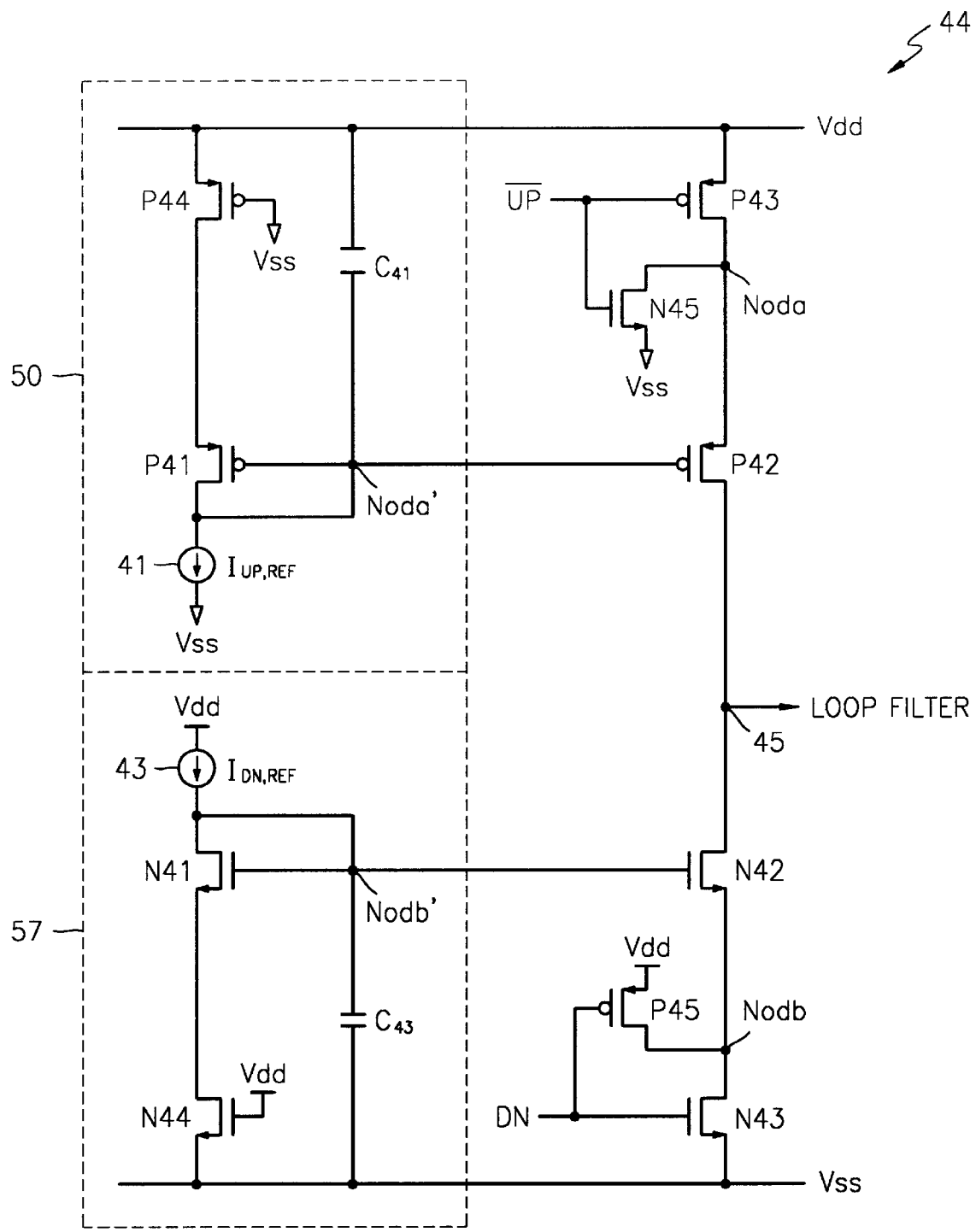
FIG. 5 is a circuit diagram illustrating a charge pump according to an embodiment of the present invention.

FIG. 5 is a circuit diagram of the charge pump circuit 44 according to an embodiment of the present invention, wherein the charge pump 44 is realized with a source switched charge pump circuit. Referring to FIG. 5, the source-switched charge pump circuit 44 comprises a first bias circuit 50, a first current source P42, a first switching transistor P43 and a pull-down transistor N45. The source-switched charge pump circuit 44 further comprises a second bias circuit 57, a second current source N42, a second switching transistor N43 and a pull-up transistor P45.

The first bias circuit 50 comprises a first PMOS matching transistor P44 having a source connected to the power supply voltage Vdd and a gate connected to the ground voltage Vss. The circuit 50 further comprises a PMOS transistor P41 having a source connected to the drain of the first matching transistor P44 and a gate and a drain connected to node Noda'. Further, a first reference current source 41 is connected between the drain of the PMOS transistor P41 and the ground voltage Vss. In addition, a first capacitor C41 is connected between node Noda' and the power supply voltage Vdd.

When an up control signal UP becomes active (e.g., logic 'high') and the first switching transistor P43 is turned on, the first PMOS matching transistor P44 operates to match a voltage drop across the first switching transistor P43 (i.e., a voltage drop between the power supply voltage Vdd and node Noda). Therefore, the first matching transistor P44 can be replaced by a component having the same impedance as that of the first switching transistor P43.

Preferably, the first matching transistor P44 and the first switching transistor P43 have the same channel length and width.

The first capacitor C41 is used for preventing rapid changes in bias voltage and stabilizing current flowing into the drain of the first current source P42.

The first current source P42, which is a PMOS transistor, has a gate connected to node Noda', a drain connected to an output terminal 45 of the charge pump circuit 44 and a source connected to node Noda.

The first switching transistor P43 has a source connected to the power supply voltage Vdd, a gate that receives an inverted UP control signal, and a drain connected to node Noda.

The pull-down transistor N45, which is an NMOS transistor, has a gate that receives the inverted UP control signal, a drain connected to node Noda and a source connected to the ground voltage Vss.

When the first control signal UP becomes inactive (e.g., logic 'low'), the pull-down transistor N45 is turned on and pulls down the voltage of node Noda to the ground voltage level Vss (0V).

Even in a case where the pull-down transistor N45 is forced to have one tenth of the driving ability of the first switching transistor P43, it operates normally so that the input load of the first switching transistor P43 does not increase considerably. Also, the driving ability of the pull down transistor N45 can be varied.

A current mirror comprises the PMOS transistor P41 of the first bias circuit 50 and the first current source P42. The P41 and P42 transistors are preferably made with long channel lengths so that they have high output impedances.

When the first switching transistor P43 is turned on, assuming the PMOS transistor P41 and the first current source P42 have the same characteristics, a first reference current $I_{UP\_REF}$ is mirrored to the drain of the first current source P42, wherein the first reference current is output or sourced to the loop filter 46 via the output terminal 45.

The second bias circuit 57 comprise a second reference current source 43 connected between the power supply voltage Vdd and node Nodb', an NMOS transistor N41 having a gate and a drain connected to node Nodb', a second matching transistor N44 having a gate to which the power supply voltage Vdd is supplied and a source to which the ground voltage Vss is supplied, and a second capacitor C43 connected between node Nodb' and ground voltage Vss.

The second matching transistor N44, which is an NMOS transistor, is used to match a voltage drop across the second switching transistor N43 (i.e., a voltage drop between node Nodb and the ground voltage Vss), when a down control signal DN becomes active (e.g., logic 'high') and the second switching transistor N43 is turned on.

Preferably, the second matching transistor N44 and the second switching transistor N43 have the same channel length and width.

The second capacitor C43 is used for preventing rapid changes in bias voltage and stabilizing current flowing into the drain of the discharge transistor N42.

The second current source N42, which is an NMOS transistor, has a gate connected to node Nodb', a drain connected to the output terminal of the charge pump and a source connected to node Nodb.

The second switching transistor N43 has a gate that receives the down control signal DN, a source connected to the ground voltage Vss and a drain connected to node Nodb.

The pull-up transistor P45, which is a PMOS transistor, has a gate that receives the down control signal DN, a source connected to the power supply voltage Vdd and a drain connected to node Nodb.

When a second control signal DN becomes inactive (i.e., logic 'low'), the pull-up transistor P45 pulls up the voltage of node Nodb to the power supply voltage level Vdd. Even in a case where the pull-up transistor P45 is forced to have one tenth of the driving ability of the second switching transistor N43, it operates normally so that the input load of the second switching transistor N43 does not increase considerably. Also, the driving ability of the pull-up transistor P45 can be varied.

The NMOS transistor N41 and the second current source N42 constitute a current mirror and they are preferably constructed with long channel lengths so that they have high output impedances. Also, the second switching transistor N43 and the second matching transistor N44 are preferably designed to have a short channel length so as to reduce input load.

When the second switching transistor N43 is turned on and assuming the NMOS transistor N41 and the second current source N42 have the same characteristics, a second reference current $I_{DN\_REF}$ is mirrored to the drain of the NMOS transistor N42 and electric charge stored in the capacitor of the loop filter 46 is discharged or sunk to the ground voltage Vss via the output terminal 45.

The operation of the source-switched charge pump in FIG. 5 will now be described in further detail. If the first control signal UP becomes active (and consequently the inverted UP control signal becomes logic 'low'), the first switching transistor P43 is turned on. Then the voltage of the node Noda is quickly charged with the power supply voltage Vdd as much as an amount of a voltage drop generated by the first switching transistor P43. Each of the transistors P41, P42, P43 and P44 normally comprise a current mirror. Consequently, charging current to which the first reference current $I_{UP\_REF}$ is mirrored flows into the drain of the first current source P42.

On the contrary, if the first control signal UP becomes inactive (and consequently the inverted UP control signal becomes logic 'high'), the first switching transistor P43 is turned off and the pull-down transistor N45 is turned on. Then, the voltage of node Noda is quickly discharged to the ground voltage Vss. Consequently, the gate-source voltage of the first current source P42 has the same value as that of the voltage of node Noda', so that the first current source P42 is turned off and the charging current is strongly blocked.

Figure 2:
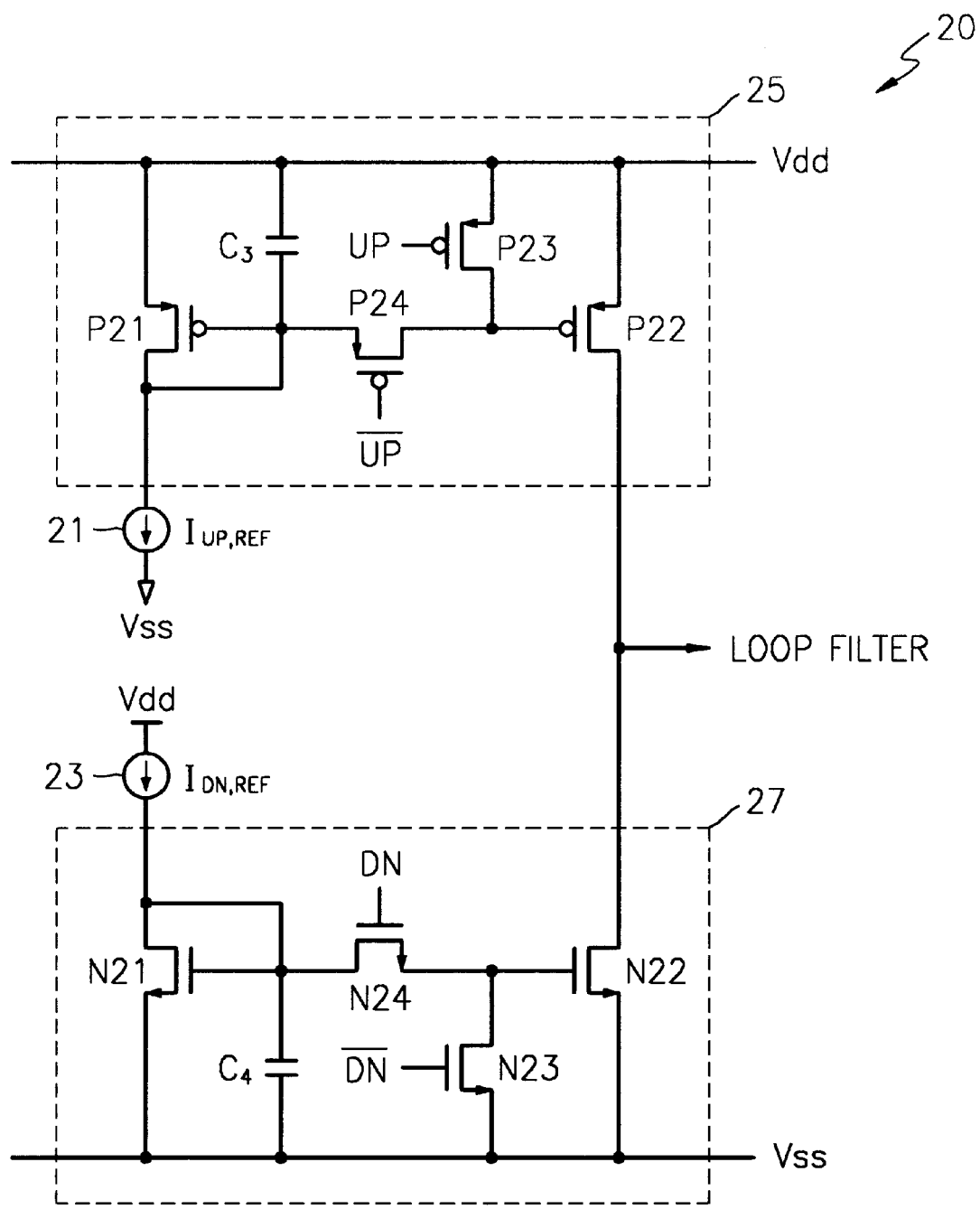
FIG. 2 is a diagram illustrating a conventional gate-switched charge pump.
Figure 3:
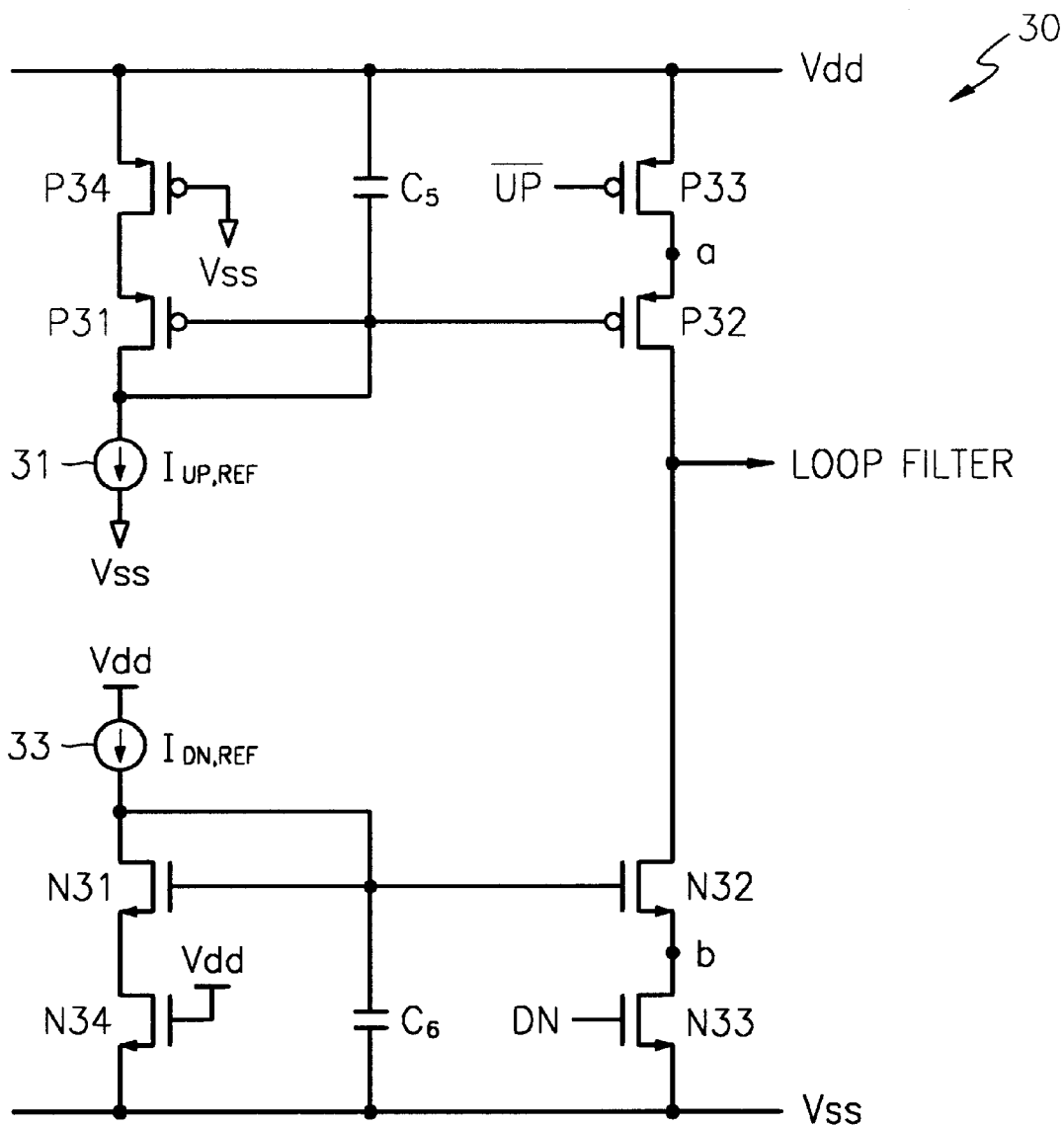
FIG. 3 is a diagram illustrating a conventional source-switched charge pump.

When the switching transistors P3, P23 and P33 of the conventional charge pump circuits 10, 20 and 30 illustrated in FIGS. 1 through 3 are turned off, the gate-source voltage of each of the transistors P2, P22 and P32 is 0V. Advantageously, in accordance with the present invention, the gate-source voltage of the first current source P42 has a positive value so that the first current source P42 is quickly turned off, thereby reducing the amount of leakage charging current.

Further, if the second control signal DN becomes active, the second switching transistor N43 is turned on and then the voltage of node Nodb is quickly discharged to a voltage close to the ground voltage level and thus each of the NMOS transistors N41, N42, N43 and N44 comprise a normal current mirror. As a result, discharging current to which the second reference current $I_{DN\_REF}$ is mirrored flows from the loop filter to the ground voltage Vss.

On the contrary, if the second control signal DN becomes inactive, the second switching transistor N43 is turned off and the pull-up transistor P45 is turned on. Then, the voltage of node Nodb is quickly charged to a voltage close to the power supply voltage Vdd. Consequently, the gate-source voltage of the first current source P42 has a value equal to the difference between the voltage of node Nodb' and the power supply voltage Vdd, so that the second current source N42 is turned off and then discharging current is rapidly blocked.

When the switching transistors N3, N23 and N33 of the conventional charge pump circuits 10, 20 and 30 illustrated in FIGS. 1 through 3 are turned off, the gate-source voltage of each of the transistors N2, N22 and N32 is 0V. Advantageously, in accordance with the present invention, the gate-source voltage of the second current source N42 has a negative value (i.e., —(the power supply voltage Vdd—the voltage of the node nodb')) so that the first current source P42 is quickly turned off, thereby reducing the amount of leakage discharge current.

Figure 6:
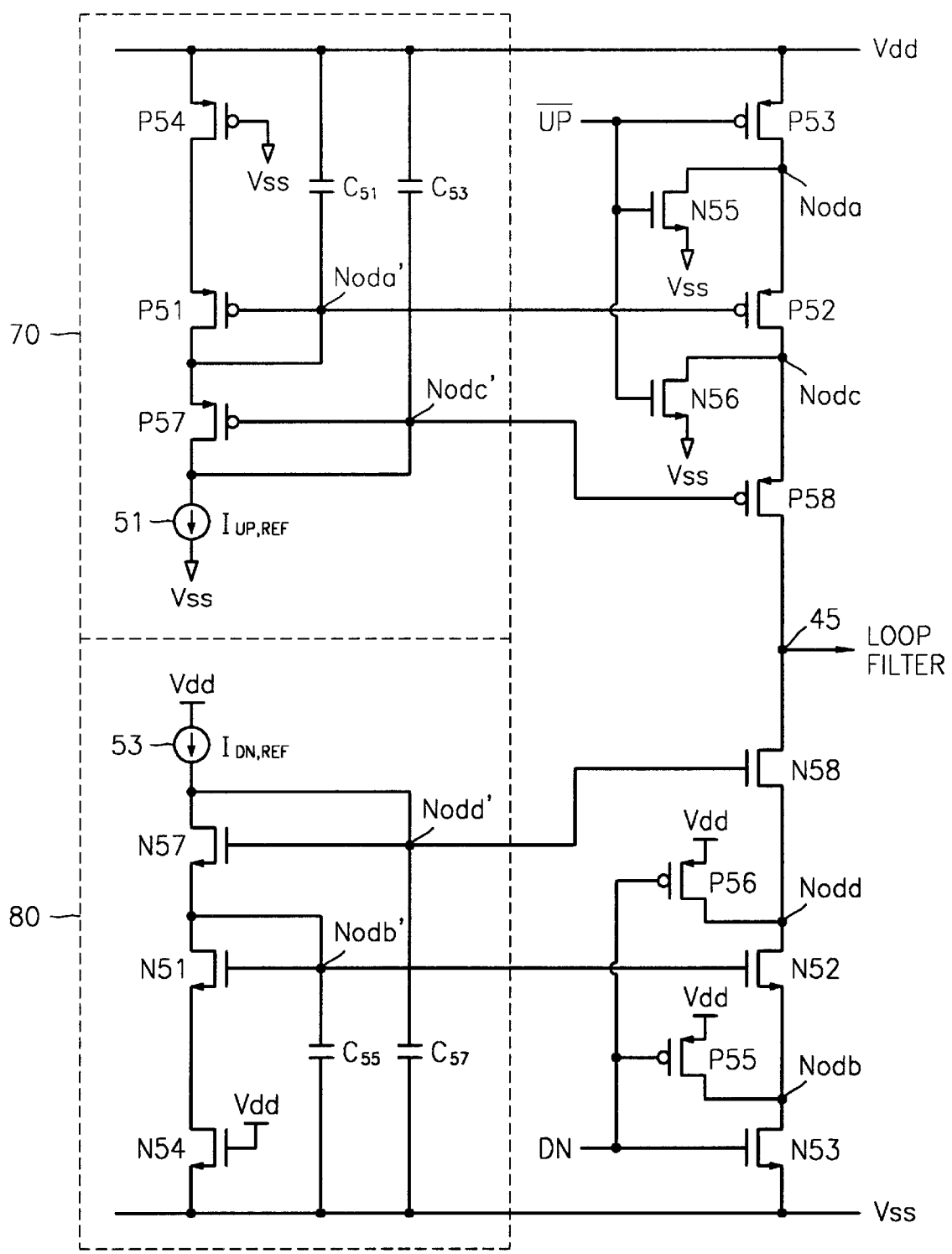
FIG. 6 is a diagram illustrating a charge pump according to another embodiment of the present invention.

FIG. 6 shows a charge pump circuit according to another embodiment of the present invention. In this embodiment, the charge pump is realized with a cascode current source charge pump circuit. The cascode current source charge pump circuit is used in applications requiring increased output impedance. Referring to FIG. 6, the cascode current source charge pump circuit comprises a first bias circuit 70, a first current source P52, a second current source P58, a first switching transistor P53, a first pull-down transistor N55 and a second pull-down transistor N56. The cascode current source charge pump circuit further comprises a second bias circuit 80, a third current source N52, a fourth current source N58, a second switching transistor N53, a first pull-up transistor P55 and a second pull-up transistor P56.

The first bias circuit 70 comprises a first reference current source 51, a first matching transistor P54, a first PMOS transistor P51, a second PMOS transistor P57 and capacitors C51 and C53. The first bias circuit 70 supplies a first bias voltage and a second bias voltage to the gate of the first current source P52 and the gate of the second current source P58, respectively.

The first reference current source 51 is connected between node Nodc' and a second power supply voltage Vss and the second PMOS transistor P57 has a gate and a drain that are connected to node Nodc' and a source connected to node Noda'.

The first PMOS transistor P51 has a drain and a gate connected to node Noda'. The first matching transistor P54 has a source connected to a first power supply voltage Vdd, a gate connected to the second power supply voltage Vss and a drain connected to the source of the first PMOS transistor P51.

The first matching transistor P54 is designed to match the impedance of the first switching transistor P53. Preferably, the first matching transistor P54 has the same characteristics as the first switching transistor P53. Instead of using the first matching transistor P54, a component having the same impedance as that of the first matching transistor P54 can be used.

The first capacitor C51, which is connected between the power supply voltage Vdd and node Noda', is used for preventing the voltage of node Noda' from rapidly changing and for stabilizing current to node Nodc. The second capacitor C53, which is connected between the first power supply voltage Vdd and node Nodc', is used for preventing the voltage of the node Nodc' from rapidly changing and for stabilizing current flowing to an output terminal 45 via the drain of the second current source P58 (i.e., the charging current).

The second current source P58 has a gate connected to node Nodc', a drain connected to the output terminal 45 and a source connected to node Nodc. The first current source P52 has a gate connected to node Noda', a drain connected to node Nodc and a source connected to node Noda.

The first switching transistor P53 has a gate that receives as input the inverted UP control signal, a source connected to the power supply voltage Vdd and a drain connected to node Noda. Accordingly, if the first control signal UP becomes active, the first switching transistor P53 is turned on. Then, the first switching transistor P53 transmits a voltage equal to the voltage difference between the power supply voltage Vdd and node Noda caused by the first switching transistor P53.

The first pull-down transistor N55, which is an NMOS transistor, has a gate that receives as input the inverted UP control signal, a drain connected to node Noda and a source connected to the second power supply voltage Vss. If the first control signal UP becomes inactive, the first pull-down transistor N55 pulls down the voltage of node Noda to the second power supply voltage Vss.

Further, even in a case where the first pull-down transistor N55 has one tenth of the driving ability of the first switching transistor P53, it operates normally so that the input load of the first switching transistor P53 does not increase considerably. In addition, the driving ability of the first pull-down transistor N55 can be varied.

The second pull-down transistor N56, which is an NMOS transistor, which receives as input the inverted UP control signal, a drain connected to node Nodc and a source connected to the second power supply voltage Vss. If the first control signal UP becomes inactive, the second pull-down transistor N56 is turned on and it pulls down the voltage of node Nodc to the second power supply voltage Vss (0V).

Further, even in a case where the second pull-down transistor N56 is forced to have one tenth of the operational ability of the first switching transistor P53, it operates normally so that the input load of the first switching transistor P53 does not increase considerably.

The second bias circuit 80 comprises a second reference current source 53, a second matching transistor N54, a first NMOS transistor N51, a second NMOS transistor N57 and capacitors C55 and C57. The second bias circuit 80 supplies a third bias voltage and a fourth bias voltage to the third current source N52 and the fourth current source N58, respectively.

The second reference current source 53 is connected between node Nodd' and a first power supply voltage Vdd. The second NMOS transistor N57 has a gate and a drain which are connected to node Nodd' and a source connected to node Nodb'.

The first NMOS transistor N51 has a drain and a gate which are connected to node Nodb'. The second matching transistor N54 has a source connected to the second power supply voltage Vss, a gate connected to the first power supply voltage Vdd, and a drain connected to a source of the first NMOS transistor N51.

The second matching transistor N54 is preferably designed to match the impedance of the second switching transistor N53. Preferably, the second matching transistor N54 has the same characteristics as the second switching transistor N53. Instead of using the second matching transistor N54, a component having the same impedance as that of the second switching transistor N53 can be used.

The third capacitor C55, which is connected between the second power supply voltage Vss and node Nodb', is used for preventing the voltage of node Nodb' from rapidly changing and stabilizing current flowing from node Nodd to the second power supply voltage Vss. The fourth capacitor C57, which is connected between the second power supply voltage Vss and node Nodd', is used for preventing the voltage of the node Nodd' from rapidly changing and stabilizing current flowing from the output terminal 45 to node Nodd.

The third current source N52 has a gate connected to node Nodb', a drain connected to node Nodd and a source connected to node Nodb. The fourth current source N58 has a gate connected to node Nodd', a drain connected to the output terminal 45 and a source connected to node Nodd.

The second switching transistor N53 has a gate that receives as input the control signal DN, a source connected to the second power supply voltage Vss and a drain connected to node Nodb. The first pull-up transistor P55, which is a PMOS transistor, has a gate that receives as input the control signal DN, a drain connected to node Nodb and a source connected to the first power supply voltage Vdd.

When the control signal DN becomes inactive, the first pull-up transistor P55 is turned on and it quickly pulls up the voltage of node Nodb to the first power supply voltage level Vdd. Further, even if the first pull-up transistor P55 has one tenth of the driving ability of the second switching transistor N53, it operates normally so that the input load of the second switching transistor N53 does not increase considerably.

The second pull-up transistor P56, which is a PMOS transistor, has a gate that receives as input the control signal DN, a drain connected to node Nodd and a source connected to the first power supply voltage Vdd.

When the control signal DN becomes inactive, the second pull-up transistor P56 is turned on and it quickly pulls up the voltage of node Nodd to the first power supply voltage level Vdd. Even if the second pull-up transistor P56 has one tenth of the driving ability of the second switching transistor N53, it operates normally so that the input load of the second switching transistor N53 does not increase considerably. The driving ability of the first and second pull-up transistors P55 and P56 can be adjusted.

The operation of the cascode current source charge pump circuit in FIG. 6 will now be described in further detail. If the control signal UP becomes active, the inverted UP control signal becomes inactive and then the first switching transistor P53 is turned on. Accordingly, if the PMOS transistors P53 and P54 have the same characteristics, the PMOS transistors P51 and P52 comprise a first current mirror and the PMOS transistors P57 and P58 also comprise a second current mirror.

If the PMOS transistors P51, P52, P57 and P58 have the same characteristics, a first reference current $I_{UP\_REF}$ is mirrored to node Nodc and the drain of the second current source P58 and output to the loop filter 46 via the output terminal.

If the channel lengths and widths of the PMOS transistors P51 and P52 comprising a current mirror are adjusted or the channel lengths and width of the PMOS transistors P57 and P58 are adjusted, current flowing into the drain of the second current source P58 can be adjusted to be different from the first reference current $I_{UP\_REF}$.

Further, if the control signal DN becomes active, the second switching transistor N53 is turned on. Accordingly, if the NMOS transistors N53 and N54 have the same characteristics, the NMOS transistors N51 and N52 comprise a third current mirror and the NMOS transistors also comprise a fourth current mirror.

If the NMOS transistors N51 and N52 comprising the third current mirror and the NMOS transistors N57 and N58 comprising the fourth current mirror have the same characteristics, current equal to a second reference current $I_{DN\_REF}$ is mirrored to node Nodd and the drain of the third current source N52, and then the current is discharged to the second power supply voltage Vss via the output terminal 45.

If the channel lengths and widths of the NMOS transistors N51, N52, N57 and N58 are adjusted, current flowing into the drain of the fourth current source N58 can be adjusted to be different from the second reference current $I_{DN\_REF}$.

If the control signal UP becomes inactive, the first switching transistor P53 is turned off and the first and second pull-down transistors N55 and N56 are turned on. Then, node Noda and node Nodc are quickly pulled down to the ground voltage Vss. Consequently, the second current source P58 is turned off due to a positive voltage of node Nodc' and Nodc and the current flowing into the drain of the second current source P58 is quickly blocked. As a result, leakage current flowing into the drain of the second current source P58 decreases rapidly.

Also, if the control signal DN becomes inactive, the second switching transistor N53 is turned off and the first and second pull up transistors P55 and P56 are turned on. Then, node Nodd and node Nodb are quickly pulled up to the power supply voltage Vdd and the fourth current source N58 is turned off due to a negative voltage of node Nodd' and node Nodd. Consequently, the current flowing into the drain of the fourth current source N58 is quickly blocked. In addition, the current flowing into the drain of node Nodd is also blocked very rapidly and leakage current flowing to the loop filter 46 via the drain of the fourth current source N58 decreases very quickly.

Figure 7:
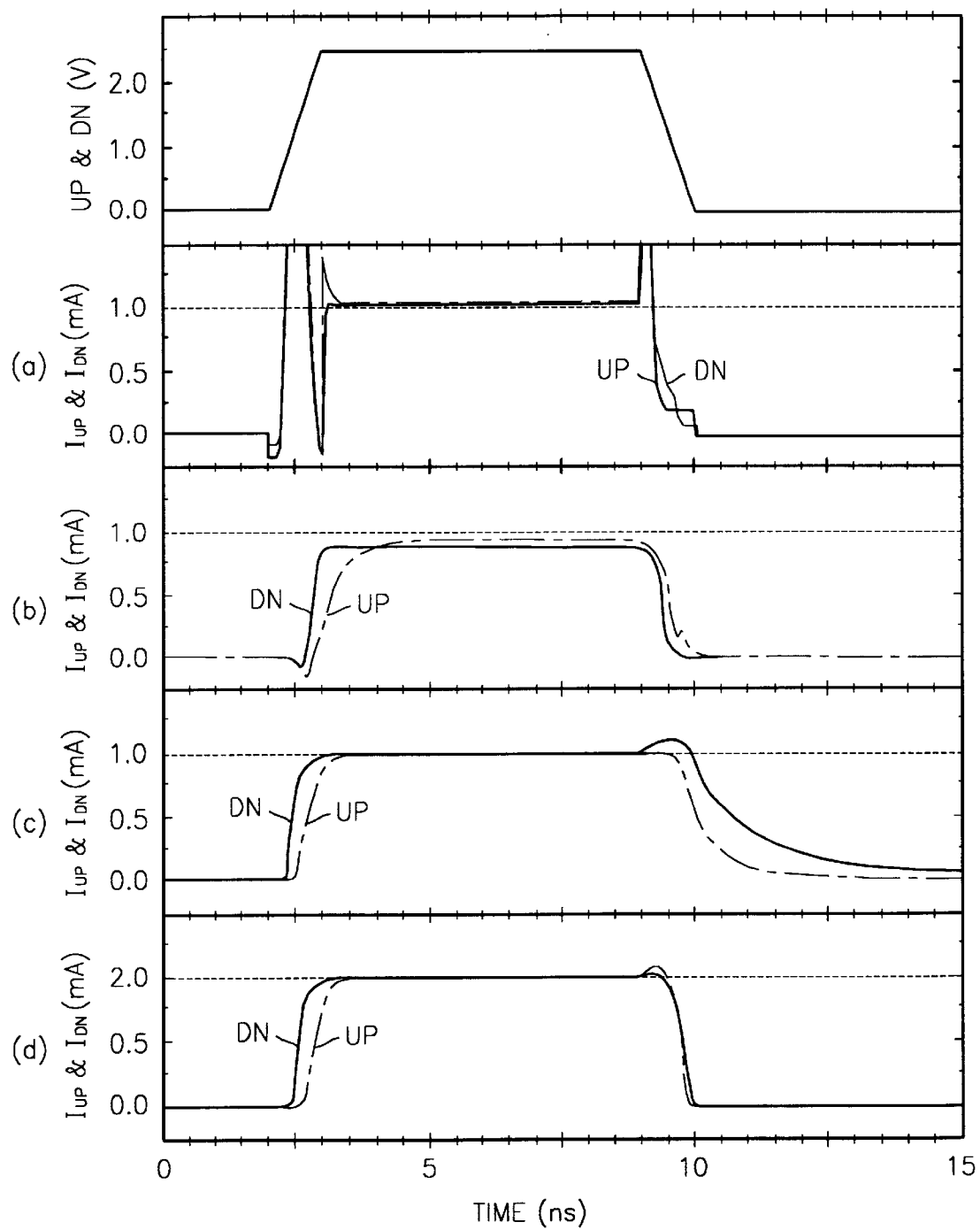
FIG. 7 illustrates waveform diagrams illustrating the output current of conventional charge pumps and charge pumps according to the present invention.

FIG. 7 illustrates waveforms of a charge pump circuit, namely, the waveforms of charging current $I_{UP}$ and discharging current $I_{DN}$ in a case where the control signal UP and the control signal DN are simultaneously changed from a logic 'low' state to a logic 'high' state and from a logic 'high' state to a logic 'low' state.

The channel length and width of each of the current mirrors (P1 and P2), (N1 and N2), (P21 and P22), (N21 and N22), (P31 and P32), (N31 and N32), (P41 and P42) and (N41 and N42) are preferably scaled so that a current of 0.1 mA can flow in the first reference current sources 11, 21, 31 and 41 and the second reference current sources 13, 23, 33 and 43 of the charge pump circuits 10, 20, 30 and 40 and a current of 1 mA can flow into the drain of each of the charging transistors P2, P22, P32 and P42 and each of the discharging transistors N2, N22, N32 and N42.

FIG. 7(a) is a simulated waveform diagram illustrating the characteristics of charge and discharge currents of the conventional drain-switched charge pump circuit 10 of FIG. 1. In this figure, the charging current $I_{UP}$ and the discharging current $I_{DN}$ of the drain-switched charge pump circuit 10 show severe spikes.

FIG. 7(b) is a simulated waveform diagram illustrating the characteristics of charge and discharge currents of the conventional gate switched charge pump circuit 20 of FIG. 2. In this figure, the charging current $I_{UP}$ and the discharging current $I_{DN}$ of the gate-switched charge pump circuit 20 has a relatively stable switching waveform; however, in a normal state, they do not reach a level of 1 mA.

FIG. 7(c) is a simulated waveform diagram illustrating the characteristics of charge and discharge currents of the conventional source-switched charge pump circuit 30 of FIG. 3. In this figure, in a case where the control signal UP and the control signal DN of the source-switched charge pump circuit 30 become active (that is, they are changed from a logic 'low' state to a logic 'high' state) the charging current $I_{UP}$ and the discharging current $I_{DN}$ have superior waveforms.

However, in a case where the control signals UP and DN become inactive (that is, they are changed from a logic 'high' state to a logic 'low' state), the waveforms of the charging current $I_{UP}$ and the discharging current $I_{DN}$ lengthen and their asymmetry increases.

FIG. 7(d) is a simulated waveform diagram illustrating the characteristics of charging and discharging currents of the source-switched charge pump circuit according to the embodiment of the present invention as illustrated in FIG. 4. In FIG. 7(d), the source-switched charge pump circuit 44 has a stable switching property and it is capable of matching the charging current $I_{UP}$ with the discharging current $I_{DN}$. Also, leakage current decreases considerably.

Figure 8:
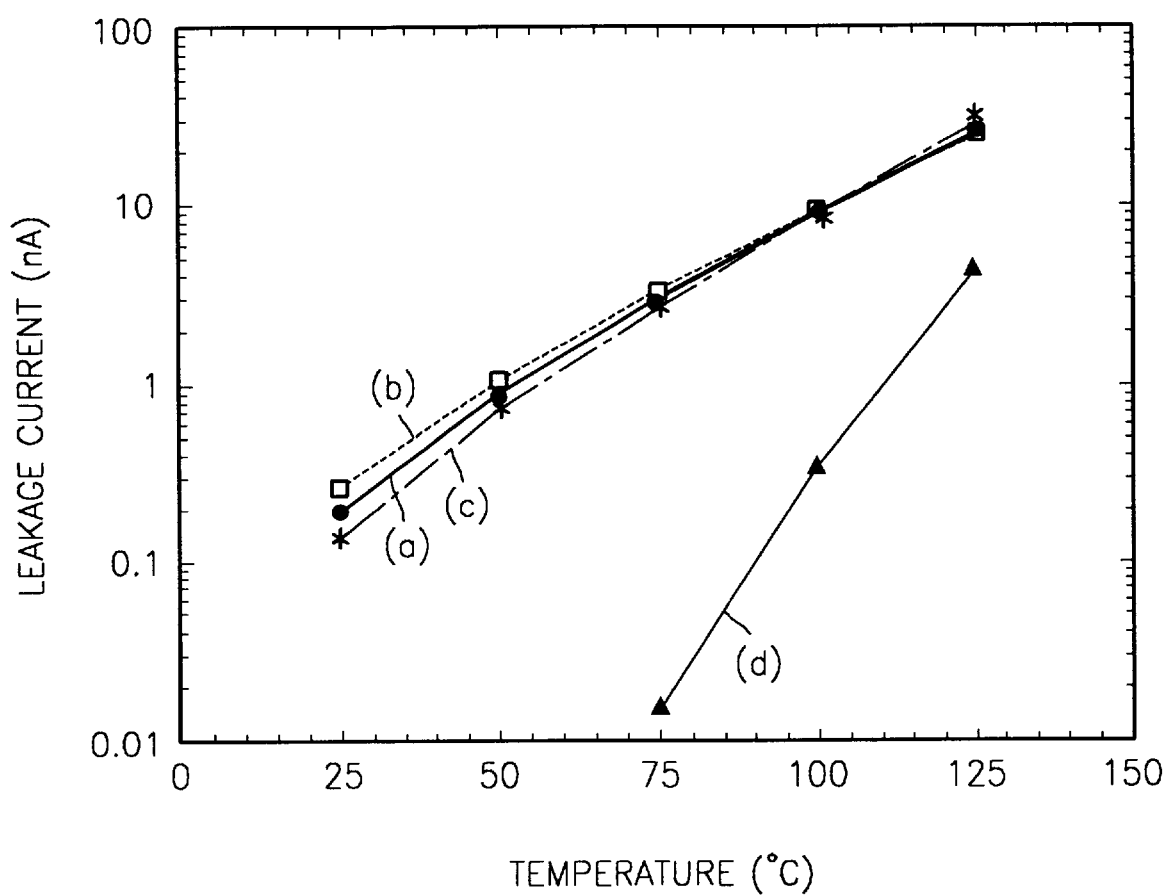
FIG. 8 is a diagram illustrating leakage current characteristics of various charge pumps based on temperature changes.

FIG. 8 is a diagram illustrating the leakage current characteristics of a charge pump according to changes in temperature in a case where the charge pump is off. In this figure, (a), (b), (c) and (d) indicate the conventional drain-switched charge pump circuit 10 of FIG. 1, the conventional gate switched charge pump circuit of FIG. 2, the conventional source-switched charge pump circuit 30 of FIG. 3 and the source-switched charge pump circuit 44 of FIG. 4 according to the embodiment of the present invention, respectively.

Referring to FIG. 8, the leakage currents of (a), (b) and (c) is exponentially increased but the leakage current of (d) is reduced so as to be less than those of (a), (b) and (c).

The PLL depicted in FIG. 4 preferably comprises a source-switched charge pump circuit 44 as depicted in FIG. 5 or a cascode current source charge pump circuit 44 as depicted in FIG. 6. A charge pump circuit 44 according to an embodiment of the present invention has a stable switching property and a current-matching property. Moreover, a PLL having a charge pump circuit according to the present invention will have only a small leakage current and, thus, the characteristics of a PLL including charge pump circuit as described herein can be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A charge pump circuit, comprising:
    a first current source for sourcing current to a first node in response to a first bias voltage;
    a second current source, operatively connected between the first node and an output terminal of the charge pump circuit, for sourcing current to the output terminal of the charge pump circuit in response to a second bias voltage;
    a first switching device, operatively connected between a first power supply and the first current source, which is switched in response to a first control signal;
    a first pull-down device for pulling down the voltage of a connection node between the first switching device and the first current source in response to the first control signal; and
    a second pull-down device for pulling down the voltage of the first node in response to the first control signal.

2. The charge pump circuit of claim 1, further comprising:
    a third current source for sinking current from the second node in response to a third bias voltage;
    a fourth current source, operatively connected between the second node and the output terminal of the charge pump circuit, for sinking current from the output terminal of the charge pump circuit in response to a fourth bias voltage;
    a second switching device, operatively connected between the third current source and a second power supply, which is switched in response to a second control signal;
    a first pull-up device for pulling up the voltage of a connection node between the second switching device and the third current source in response to the second control signal; and
    a second pull-up device for pulling up the voltage of the second node in response to the second control signal.

3. The charge pump circuit of claim 1, further comprising a first bias circuit for generating the first bias voltage and the second bias voltage.

4. The charge pump circuit of claim 2, further comprising a second bias circuit for generating the third bias voltage and the fourth bias voltage.

5. A phase locked loop, comprising:
    a loop filter;
    a voltage controlled oscillator for outputting an internal signal in response to an output signal of the loop filter;
    a phase detector for detecting a difference in phase between a reference and the internal signal and outputting one of a first control signal and a second control signal; and
    a charge pump circuit, operatively connected between the phase detector and the loop filter, for controlling the output voltage of the loop filter in response to the first control signal or the second control signal,
    wherein the charge pump circuit comprises:
        a first current source for sourcing current to a first node in response to a first bias voltage;
        a second current source, operatively connected between the first node and an output terminal of the charge pump circuit, for sourcing current to the output terminal of the charge pump circuit in response to a second bias voltage;
        a first switching device, operatively connected between a first power supply and the first current source, which is switched in response to a first control signal;
        a first pull-down device for pulling down the voltage of a connection node between the first switching device and the first current source in response to the first control signal; and
        a second pull-down device for pulling down the voltage of the first node in response to the first control signal.

6. The phase locked loop of claim 5, wherein the charge pump circuit further comprises:
    a third current source for sinking current from a second node in response to a third bias voltage;
    a fourth current source, operatively connected between the third current source and the output terminal of the charge pump circuit, for sinking current from the output terminal of the charge pump circuit in response to a fourth bias voltage;
    a second switching device, operatively connected between the second node and a second power supply, which is switched in response to a second control signal;
    a first pull-up device for pulling up the voltage of a connection node between the second switching device and the third current source in response to the second control signal; and
    a second pull-up device for pulling up the voltage of the second node in response to the second control signal.

7. The phase locked loop of claim 5, wherein the charge pump circuit further comprises a first bias circuit for generating the first bias voltage or the second bias voltage.

8. The phase locked loop of claim 6, wherein the charge pump circuit further comprises a second bias circuit for generating the third bias voltage and the fourth bias voltage.

* * * * *